United States Patent
Han et al.

(10) Patent No.: US 11,094,820 B2
(45) Date of Patent: Aug. 17, 2021

(54) MOBILE FERROELECTRIC SINGLE DOMAIN WALL IMPLEMENTATION OF A SYMMETRIC RESISTIVE PROCESSING UNIT

(71) Applicant: International Business Machines Corporation, Armonk, NY (US)

(72) Inventors: Jin-Ping Han, Yorktown Heights, NY (US); Ramachandran Muralidhar, Mahopac, NY (US); Dennis M. Newns, Yorktown Heights, NY (US); Paul M. Solomon, Westchester, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/846,461

(22) Filed: Apr. 13, 2020

(65) Prior Publication Data
US 2020/0243688 A1     Jul. 30, 2020

Related U.S. Application Data

(62) Division of application No. 15/464,943, filed on Mar. 21, 2017, now Pat. No. 10,680,105.

(51) Int. Cl.
*H01L 29/78*     (2006.01)
*H01L 27/1159*   (2017.01)
(Continued)

(52) U.S. Cl.
CPC .... *H01L 29/78391* (2014.09); *H01L 27/1159* (2013.01); *H01L 29/40111* (2019.08); *H01L 29/6684* (2013.01)

(58) Field of Classification Search
CPC ........ H01L 29/78391; H01L 29/40111; H01L 29/6684; H01L 29/516; H01L 29/40; H01L 29/401; H01L 29/4011; H01L 29/66; H01L 29/668; H01L 29/78; H01L 29/783; H01L 29/7839; H01L 29/74; H01L 29/8391; H01L 27/11585; H01L 27/1159; G11C 11/22; G11C 11/223
See application file for complete search history.

(56) References Cited

U.S. PATENT DOCUMENTS

| | | |
|---|---|---|
| 5,136,176 A | 8/1992 | Castro |
| 5,384,729 A | 1/1995 | Sameshima |

(Continued)

OTHER PUBLICATIONS

Frank et al., "The Quantum Metal Ferroelectric Field-Effect Transistor", IEEE Transactions on Electron Devices, vol. 61, No. 6, Jun. 2014, pp. 2145-2153.

(Continued)

*Primary Examiner* — Monica D Harrison
*Assistant Examiner* — John Lin
(74) *Attorney, Agent, or Firm* — Cantor Colburn LLP; Randall Bluestone

(57) ABSTRACT

A method of fabricating a symmetric element of a resistive processing unit (RPU) includes forming a substrate with a channel region connecting two doped regions, and forming a source above one of the two doped regions and a drain above the other of the two doped regions. A gate is formed above the channel region, and a bar ferroelectric is disposed above the channel region and below the gate.

15 Claims, 12 Drawing Sheets

(51) Int. Cl.
*H01L 29/66* (2006.01)
*H01L 21/28* (2006.01)

(56) References Cited

U.S. PATENT DOCUMENTS

| | | | |
|---|---|---|---|
| 5,668,508 A | | 9/1997 | Pulvirenti et al. |
| 5,825,218 A | | 10/1998 | Colli et al. |
| 6,597,598 B1 | | 7/2003 | Tran et al. |
| 6,597,898 B1 | | 7/2003 | Iwata et al. |
| 7,079,436 B2 | | 7/2006 | Perner et al. |
| 8,183,554 B2 | | 5/2012 | Mouttet |
| 8,275,727 B2 | | 9/2012 | Elmegreen et al. |
| 8,929,126 B2 | | 1/2015 | Siau |
| 9,166,147 B2 | | 10/2015 | Carman et al. |
| 9,312,471 B2 | | 4/2016 | Bibes et al. |
| 9,466,362 B2 | | 10/2016 | Yu et al. |
| 9,852,790 B1 | | 12/2017 | Gokmen et al. |
| 2009/0050949 A1* | | 2/2009 | Maruyama ......... H01L 29/6684 257/295 |
| 2009/0161523 A1* | | 6/2009 | Tran ................. G11B 9/02 369/126 |
| 2014/0233297 A1 | | 8/2014 | Ozyilmaz et al. |
| 2015/0170025 A1 | | 6/2015 | Wu et al. |
| 2015/0357429 A1* | | 12/2015 | Dubourdieu ......... H01L 29/516 257/295 |
| 2016/0049195 A1 | | 2/2016 | Yu et al. |
| 2018/0277683 A1 | | 9/2018 | Han et al. |

OTHER PUBLICATIONS

Gokmen et al., "Acceleration of Deep Neural Network Training with Resistive Cross-Point Devices", retrieved Nov. 13, 2019, pp. 1-19, retrieved from http://arxiv.org/ftp/arxiv/papers/1603/1603.07341.pdf.

Gokmen et al. "Acceleration of Deep Neural Network Training with Resistive Cross-Point Devices: Design Considerations", Frontiers in Neuroscience, vol. 10, Article 333, 2016, pp. 1-13.

List of IBM Patents or Patent Applications Treated as Related; (Appendix P), Filed Apr. 13, 2020; 2 pages.

Nawrocki et al., "A Mini Review of Neuromorphic Architectures and Implementations", IEEE Transactions on Electron Devices, vol. 63, No. 10, Oct. 2016, pp. 3819-3829.

* cited by examiner

MOBILE FERROELECTRIC SINGLE DOMAIN WALL IMPLEMENTATION OF A SYMMETRIC RESISTIVE PROCESSING UNIT

DOMESTIC PRIORITY

This application is a division of U.S. application Ser. No. 15/464,943 filed Mar. 21, 2017, the disclosure of which is incorporated herein by reference in its entirety.

BACKGROUND

The present invention relates to analog memory elements, and more specifically, to a mobile ferroelectric single domain wall implementation of a symmetric resistive processing unit (RPU).

Many computer-implemented applications are computationally intensive and require parallel processing. For example, in machine learning or supervised learning, deep neural network (DNN) training techniques require memory calls that can add up over billions of cycles and, thus, benefit from fast memory access. RPUs are arrays of memory elements that combine processing and non-volatile memory and can fetch data as fast as it is processed at lower voltages compared to more traditional non-volatile memory (NVM) devices.

SUMMARY

According to embodiments of the present invention, a method of fabricating a symmetric element of a resistive processing unit (RPU) includes forming a substrate with a channel region connecting two doped regions, and forming a source above one of the two doped regions and a drain above the other of the two doped regions. A gate is formed above the channel region, and a bar ferroelectric is disposed above the channel region and below the gate.

According to other embodiments of the invention, a method of obtaining a mobile ferroelectric single domain wall implementation of a symmetric resistive processing unit (RPU) includes applying a positive pinning voltage to a first end of a bar ferroelectric, and applying a negative pinning voltage to a second end of the bar ferroelectric. The second end is opposite the first end. The method also includes applying positive pulses across the bar ferroelectric to achieve the single domain wall, and applying additional positive pulses across the bar ferroelectric to move the single domain wall in a first direction.

According to yet other embodiments of the invention, a symmetric element of a resistive processing unit (RPU) includes a substrate with a channel region connecting two doped regions, a source above one of the two doped regions, and a drain above the other of the two doped regions. A gate is above the channel region, and a bar ferroelectric is above the channel region and below the gate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As previously noted, RPUs are hardware memory devices that significantly increase the speed of memory access at lower voltages compared to conventional NVM devices. RPUs are physical analog memory components. An RPU can be included in an array of thousands of memory elements (e.g., 4000-by-4000 elements) that can be used to simulate synapses in supervised learning, for example. Writing to an RPU memory element is accomplished by applying an electric field pulse. A more challenging aspect of existing RPUs has involved accomplishing symmetry. Symmetry refers to the fact that a pulse of the same amplitude used to write data to a memory element can also be used to erase the data in the memory element of the RPU. Symmetry of the RPU elements is an important factor in ensuring accuracy.

Turning now to an overview of one or more embodiments of the invention, a ferroelectric memory element is used to implement each memory element of a symmetric RPU. A ferroelectric can be subjected to a spontaneous electric polarization. A bar ferroelectric can be made to exhibit a different polarization at each end. The border between two different polarizations is referred to as the domain wall. A mobile ferroelectric single domain wall refers to the ability to move the domain wall that separates the two polarizations in a bar ferroelectric. The domain wall can be moved by applying an electric field. This movement changes the conductance of a ferroelectric field effect transistor (FEFET) in which the bar ferroelectric is disposed between the channel and the gate. The conductance can indicate a value such that affecting the conductance by moving the domain wall results in the FEFET storing a particular data value. One or more embodiments of the invention described herein are directed to a symmetric RPU memory element because the value written by moving the domain wall based on applying a specific electric field can be erased by applying a negative field of the same value.

Figure 1:
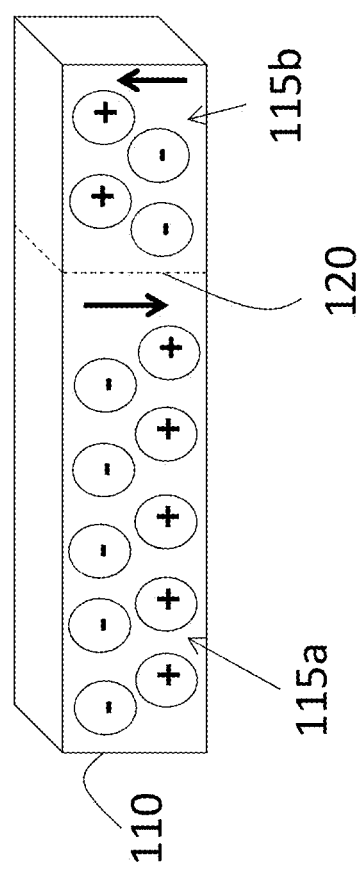
FIG. 1 is a bar of ferroelectric material according to embodiments of the invention.

Turning now to an exemplary embodiment of the invention, a bar ferroelectric 110 is shown in FIG. 1. Two portions 115a, 115b of the bar ferroelectric 110 are indicated. The two portions 115a, 115b exhibit opposite polarities, as indicated by the arrows in FIG. 1. The polarizations are achieved as discussed with reference to FIG. 2. A domain wall 120 is used to indicate a border between the two portions 115a, 115b of the bar ferroelectric 110 that have the opposite polarities. When an electric field is applied across the bar ferroelectric 110, the domain wall 120 moves. That is, the dimensions of the two portions 115a, 115b are not fixed. Instead, based on the application of the electric field, the polarity of the bar ferroelectric 110 on one side or the other of the domain wall 120 (in part 115a or in 115b) changes. As such, the domain wall 120, which is an indication of the border between the two polarities, moves.

Figure 2:
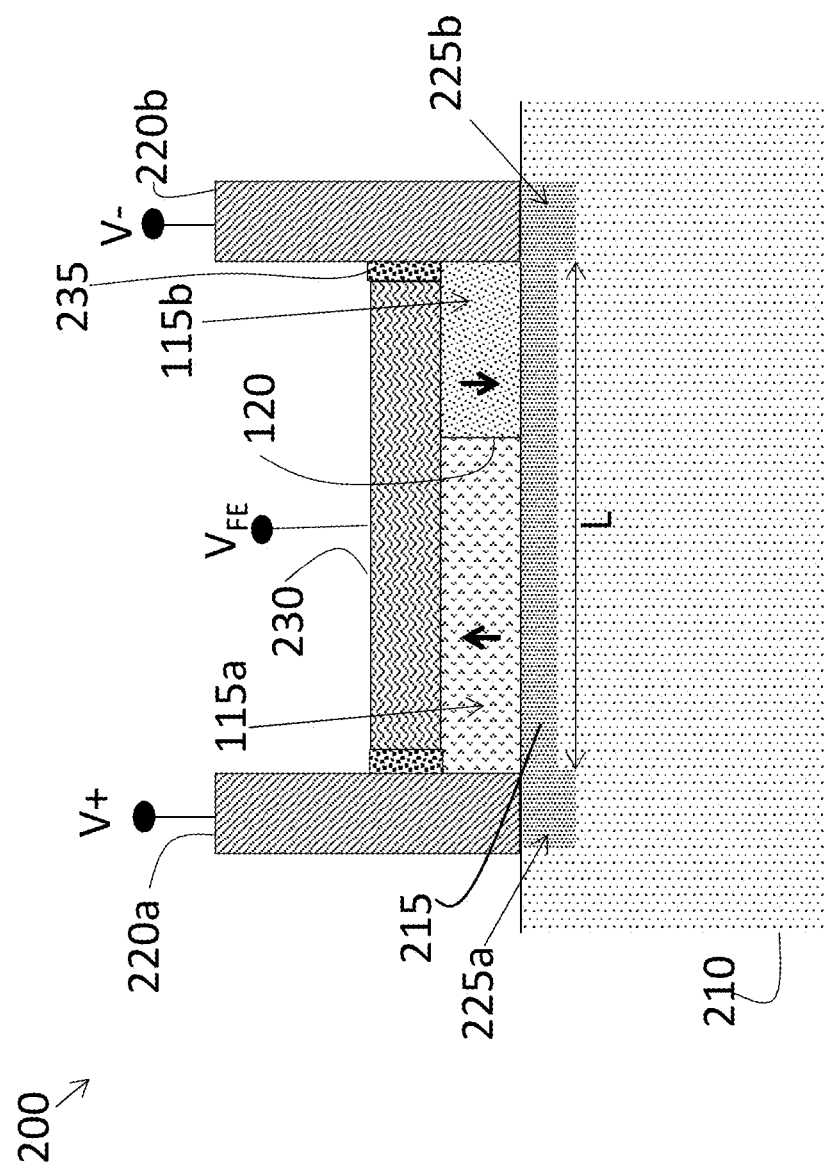
FIG. 2 is a cross-sectional view of a ferroelectric field effect transistor (FEFET) according to embodiments of the invention.

FIG. 2 is a cross-sectional view of an exemplary FEFET 200 which acts as an RPU element according to one or more embodiments. The substrate 210 includes a channel region 215. The length L of the channel region 215 is on the order of 0.1 to 1 micrometers according to an exemplary embodiment. The bar ferroelectric 110 is disposed between the channel region 215 and a gate 230. Source 220a and drain 220b terminals are formed above doped regions 225a, 225b within the substrate 210. An insulator 235 acts as a spacer that separates the gate 230 from the source 220a and drain 220b. In alternate embodiments, the source 220a and drain 220b can be reversed from the positions shown in FIG. 2. In the exemplary FEFET 200 shown in FIG. 2, the doped regions 225a, 225b are n++ doped. Applying the pinning voltages V+ and V− to the source 220a and drain 220b terminals at each end of the bar ferroelectric 110 results in the two portions 115a and 115b having opposite polarities. Applying an electric field across the bar ferroelectric 110 facilitates moving the domain wall 120. This is accomplished through the voltage $V_{FE}$ on the gate 230.

The position of the domain wall 120 determines the conductance of the FEFET 200. Thus, the conductance, which can be controlled by controlling the position of the domain wall 120, can be used to read a value stored by the FEFET 200. The maximum conductance ratio, which is a ratio of the conductance achieved with the domain wall as close as possible to the source 220a to the conductance achieved with the domain wall as close as possible to the drain 220b, can be on the order of 10, for example. This determines the dynamic range of conductance values and corresponds with the values that can be stored by the RPU element.

The exemplary polarizations indicated for the portions 115a, 115b and the relative position of the domain wall 120 in FIG. 2 indicate a higher conductance than if the domain wall 120 were closer to the drain 220b. That is, the conductance is greater if the portion 115a is smaller than the portion 115b according to the polarity indicated in FIG. 2. Based on the exemplary polarizations shown in FIG. 2 for portions 115a and 115b, when $V_{FE}$ is a positive voltage, the domain wall 120 moves toward the source 220a, and when $V_{FE}$ is a negative voltage, the domain wall 120 moves toward the drain 220b. The voltage values needed for $V_{FE}$ can be determined based on the coercive field Ec of the bar ferroelectric 110, which is a measureable value for each bar ferroelectric 110.

The substrate 210 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 210 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 210 can also include an organic semiconductor or a layered semiconductor such as, for example, Si/SiGe, a silicon-on-insulator or a SiGe-on-insulator. A portion or entire semiconductor substrate 210 can be amorphous, polycrystalline, or monocrystalline. In addition to the aforementioned types of semiconductor substrates 210, the semiconductor substrate 210 can also include a hybrid oriented (HOT) semiconductor substrate in which the HOT substrate has surface regions of different crystallographic orientation. The semiconductor substrate 210 can be doped, undoped, or contain doped regions and undoped regions therein. The semiconductor substrate 210 can contain regions with strain and regions without strain therein, or contain regions of tensile strain and compressive strain. In one or more embodiments, the substrate 210 can be a semiconductor-on-insulator (SOI) substrate. The substrate 210 can further include other structures (not shown) such as shallow trench isolation (STI), fins, nanowires, nanosheets, resistors, capacitors, etc. The formation of the intermediate structure shown in FIG. 2 is known and not further detailed herein.

Figure 3:
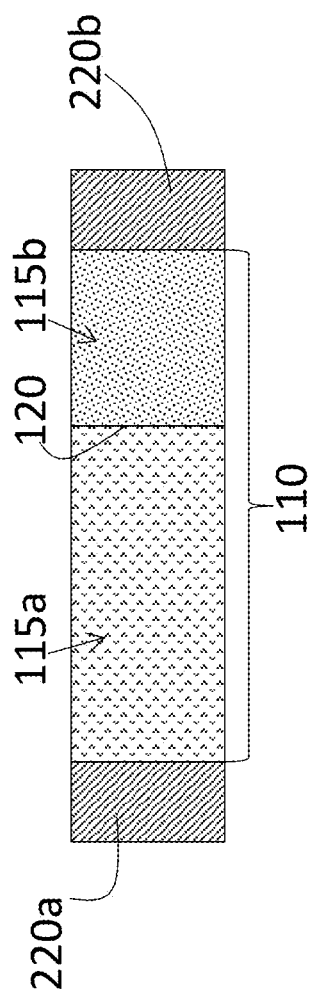
FIG. 3 is a cross-sectional view of the FEFET of FIG. 2.

FIG. 3 is a cross-sectional view of the FEFET 200 below the gate 230. As FIG. 3 indicates, the two portions 115a, 115b of the bar ferroelectric 110 are adjacent to each other and separated by the domain wall 120 in the same plane as the source 220a and drain 220b. That is, only one of the portions 115a, 115b of the bar ferroelectric 110 is in contact with the source 220a or drain 220b. Application of an electric field across the bar ferroelectric 110 results in movement of the domain wall 120 closer to either the source 220a or the drain 220b according to the embodiment shown in FIG. 3.

Figure 4:
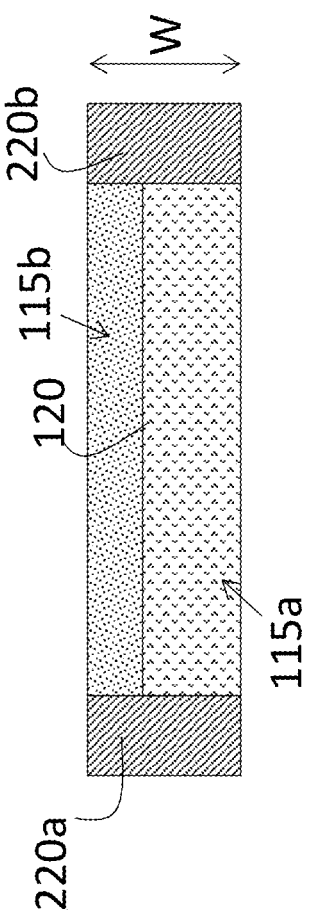
FIG. 4 is a cross-sectional view of a different embodiment of the FEFET shown in FIG. 2.

FIG. 4 is a cross-sectional view of another embodiment of the FEFET 200 below the gate 230. According to the embodiment shown in FIG. 4, the two portions 115a, 115b of the bar ferroelectric 110 are adjacent to each other and are separated by the domain wall 120 in a plane that is perpendicular to a plane of the source 220a and drain 220b. That is, both portions 115a, 115b of the bar ferroelectric 110 are in contact with the source 220a and the drain 220b. Application of an electric field across the bar ferroelectric 110 results in movement of the domain wall 120 along a side of the source 220a and the drain 220b according to the embodiment shown in FIG. 4. The width W is on the order of 0.1 to 1 micrometers.

Figure 5:
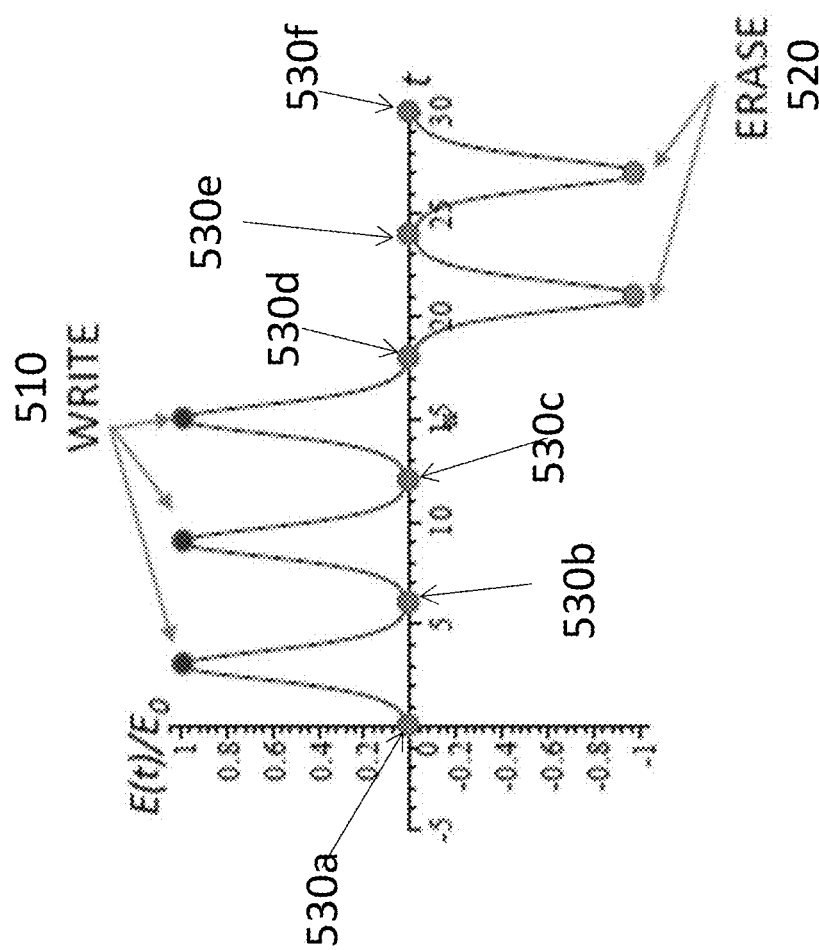
FIG. 5 shows write pulses and erase pulses applied to the bar of ferroelectric material according to one or more embodiments of the invention.

FIG. 5 shows write pulses 510 and erase pulses 520 applied to the bar ferroelectric 110 according to one or more embodiments of the invention. Time t is shown on one axis, as indicated, and pulse amplitude is shown on the other axis. E(t) is the applied pulse and $E_0$ is proportional to the coercive field Ec of the bar ferroelectric 110. The write pulses 510 are positive pulses E(t) and the erase pulses 520 are negative pulses of the same amplitude as the positive write pulses 510. This indicates the symmetry of the FEFET 200. Several read phases 530a through 530f (generally referred to as 530) are indicated between the applications of pulses. The conductance of the FEFET 200 can be determined during the read phase 530, and this conductance indicates the value stored by the FEFET 200. The read phases 530 are further discussed with reference to FIG. 6.

Figure 6:
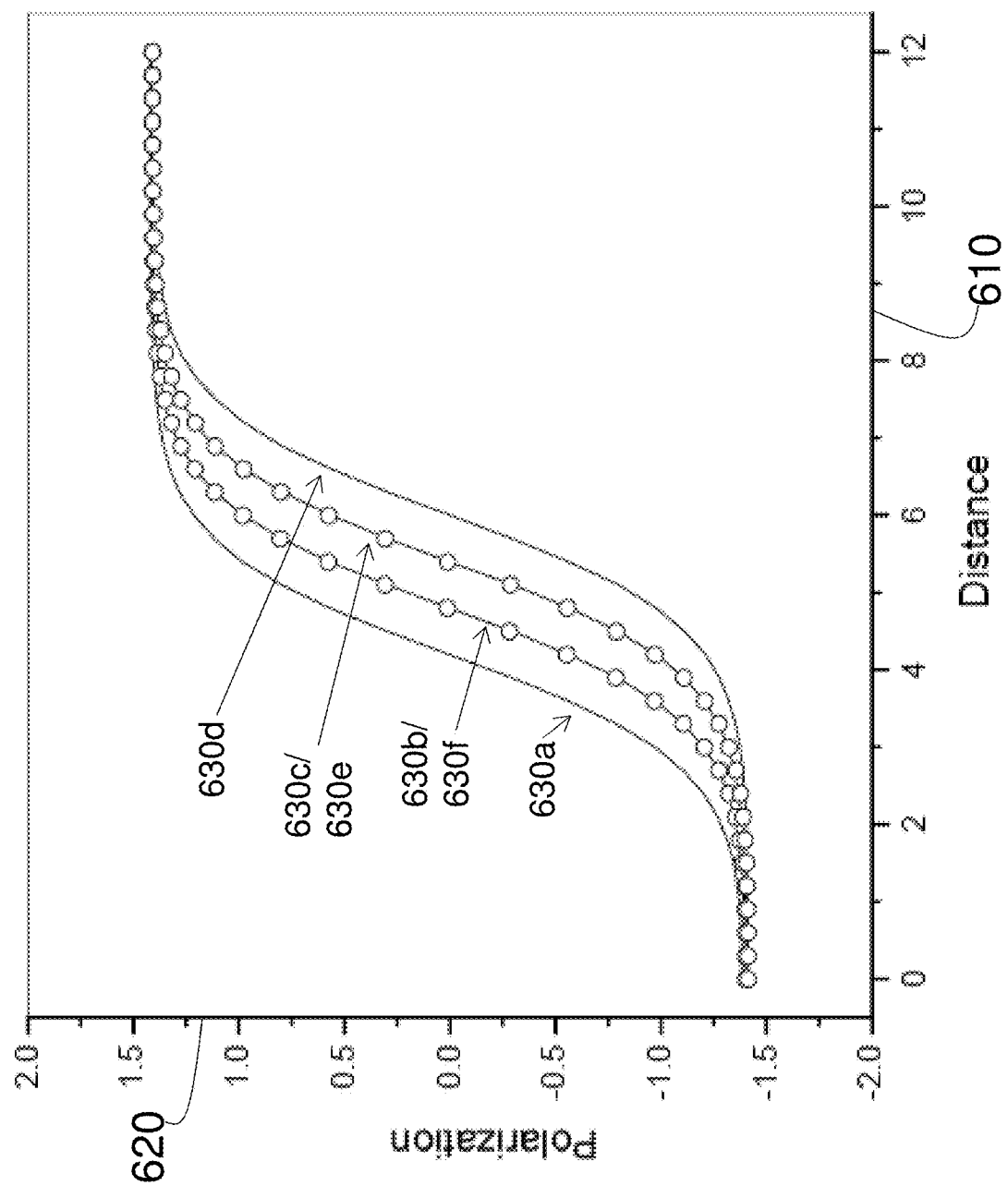
FIG. 6 shows the polarization curves that correspond with each read phase shown in FIG. 5.

FIG. 6 shows the polarization curves 630a through 630e (generally referred to as 630) that correspond with each read phase 530 shown in FIG. 5. Distance along the bar ferroelectric 110 is shown on axis 610. The length of the exemplary bar ferroelectric 110 is 12 units. Polarization is shown on axis 620. The polarization curve 630a corresponds with the read phase 530a, prior to any pulses being applied to the gate 230. After the first write pulse 510 is applied, the read phase 530b results. As corresponding polarization curve 630b indicates, the write pulse 510 causes a shift by a unit distance. That is, the domain wall 120 is moved such that the polarization that the bar ferroelectric 110 had at a given distance is now shifted by one unit distance. As polarization curve 630c, which corresponds with the read phase 530c that follows another write pulse 510 indicates, the second write pulse 510 results in another shift by a unit distance in the polarization curve 630c. Similarly, the polarization curve 630d is shifted by a unit distance from the polarization curve 630c. This is because polarization curve 630d corresponds with read phase 530d, which follows another (the third) write pulse 510 shown in FIG. 5.

Following the read phase 530d, an erase pulse 520 is applied, as shown in FIG. 5. Because of the symmetry exhibited by the RPU element (e.g., FEFET 200) that includes the bar ferroelectric 110, the erase pulse 520 shifts the domain wall 120 back by one unit distance since each write pulse 510 shifted the domain wall 120 forward by one unit distance. As such, the polarization curve 630e that corresponds with the read phase 530e following the first erase pulse 520 is the same as the polarization curve 630c, which characterized the bar ferroelectric 110 prior to the last write pulse 510. A second erase pulse 520 precedes the read phase 530f. This second erase pulse 520 shifts the domain wall 120 back one unit distance again. As such, the polarization curve 630f, which corresponds with read phase 530f, is the same as the polarization curve 630b, which characterized the bar ferroelectric 110 prior to the last two write pulses 510.

Figure 7:
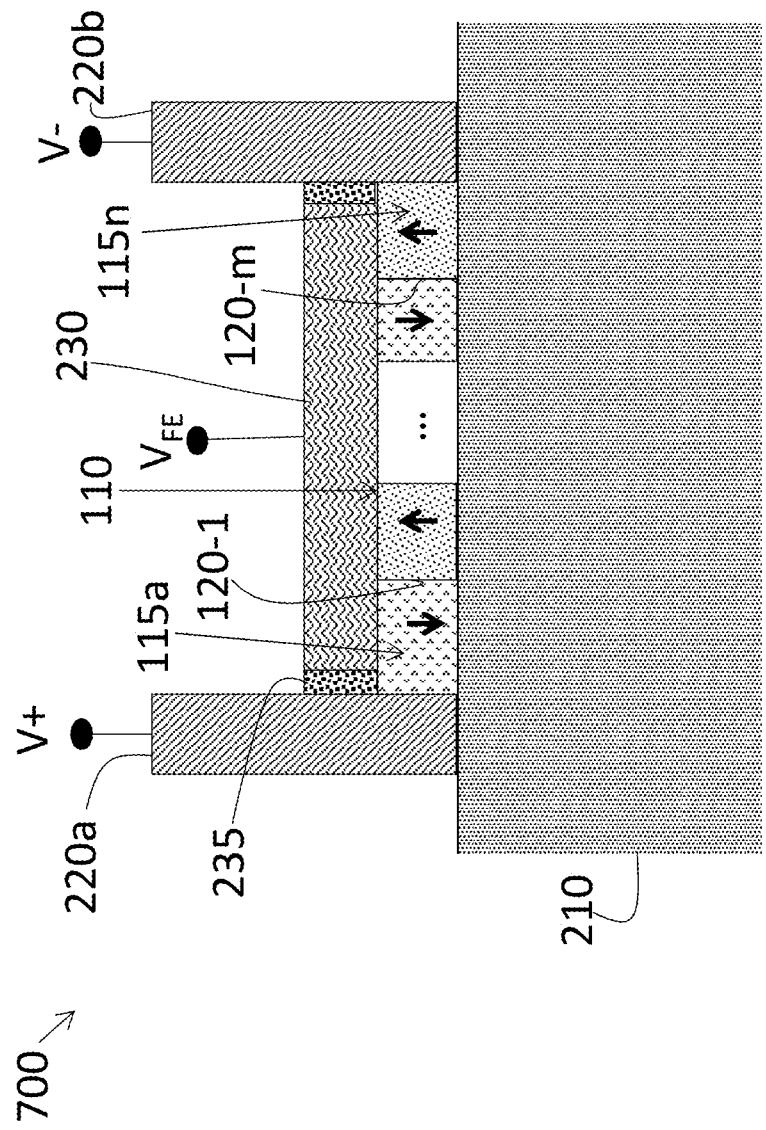
FIG. 7 shows a multi-domain bar of ferroelectric material according to one or more embodiments of the invention.

FIG. 7 shows a multi-domain bar ferroelectric 110 according to one or more embodiments of the invention. The bar ferroelectric 110 includes portions 115a through 115n (generally referred to as 115) separated by domain walls 120-1 through 120-m (generally referred to as 120). A bar ferroelectric 110 with a single domain wall 120 is desirable because the conductance and, thus, the value stored by the RPU element is controllable based on controlling the position of the single domain wall 120. Symmetry is more easily achieved with the single domain wall 120. However, in practice, when the pinning voltages V+ and V− are applied, the bar ferroelectric 110 with multiple portions 115 separated by multiple domain walls 120 can result. The bar ferroelectric 110 with multiple domain walls 120, as shown in FIG. 7, can be converted to bar ferroelectric 110 with a single domain wall 120, as shown in FIGS. 2-4, based on applying pulses of voltage $V_{FE}$ on the gate 230. As discussed with reference to FIG. 5, applying pulses moves the domain wall 120 to change the conductance of the FEFET 200, as well. This is further explained with reference to FIG. 8.

Figure 8:
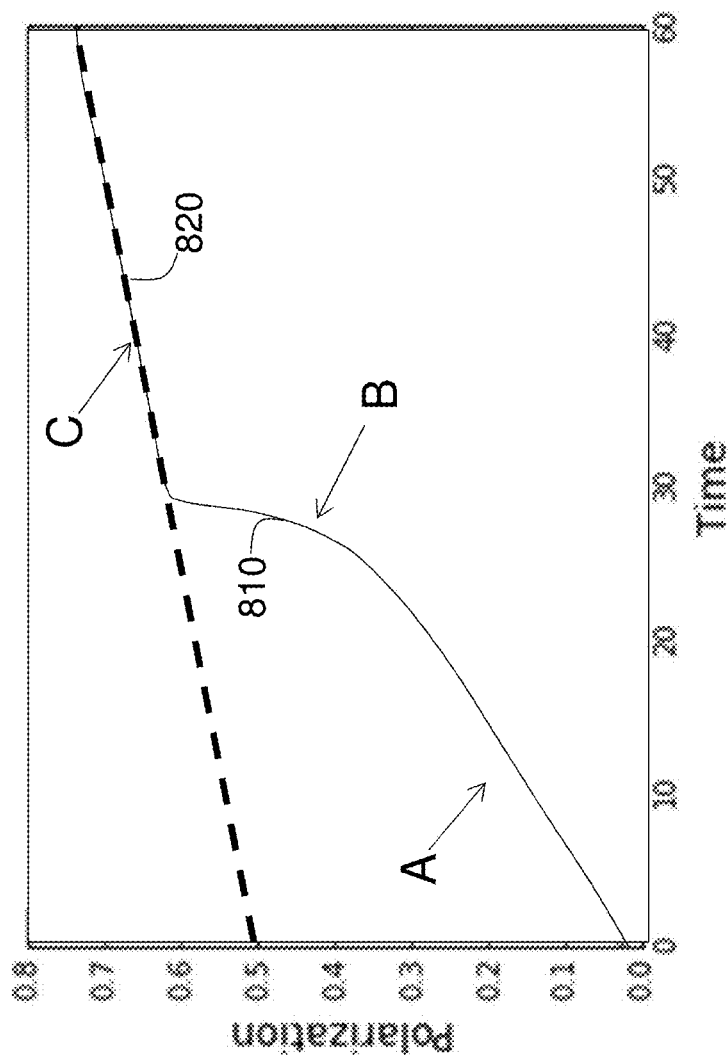
FIG. 8 shows the process of obtaining a symmetric single domain wall bar ferroelectric according to one or more embodiments of the invention.

FIG. 8 shows the process of obtaining a symmetric single domain wall 120 bar ferroelectric 110 according to one or more embodiments. As previously noted, the bar ferroelectric 110 can have multiple domain walls 120 based on the application of pinning voltages V+ and V−, as shown in FIG. 7. As also previously discussed, with reference to FIGS. 5 and 6, positive and negative pulses can be applied to a single domain wall 120 bar ferroelectric 110 to move the domain wall 120 in a known and symmetric manner. This procedure is used to write and read values into the RPU element that includes the bar ferroelectric 110.

However, when the bar ferroelectric 110 initially includes multiple domain walls 120, the symmetry needed to accurately write and read values from the RPU element is not present. FIG. 8 shows a curve 810 indicating the polarization change over time as positive pulses are continually applied to a bar ferroelectric 110. As curve 810 shows, polarization change is gradual in region A. In region B, domain merging occurs and the multiple domain walls 120 merge into a single domain wall 120 resulting in abrupt change of polarization. This single domain wall 120 now separates regions of negative and positive polarization and is stabilized by opposite polarity of pinning boundaries. After this stage, in region C, the subsequent application of positive pulses results in a linear change in polarization, as shown. Specifically, the result of applying positive pulses is an increase in polarization, as shown.

In region C, the dashed line 820 indicates that, after sufficient positive pulses have been applied to achieve the merge of multiple domain walls 120 into a single domain wall 120, the application of negative pulses (erase pulses) would result in the polarization staying on the line shown in region C but decreasing rather than increasing. The continued application of negative pulses would result in the polarization decreasing along the dashed line 820 until the domain wall moves to one end of the bar ferroelectric 110. Subsequent application of positive and negative pulses moves the polarization up and down along the dashed line 820. Of course, the negative pulses (and the resulting polarization) that result in the polarization shown by dashed line 820 would occur later in time than the range shown in FIG. 8. The bar ferroelectric 110 can be oriented as shown in FIG. 3 or FIG. 4. In either case, application of the positive pulses will result in the merge of multiple domain walls 120 into a single domain wall 120 that facilitates the previously detailed symmetric write and erase operations.

Figure 9:
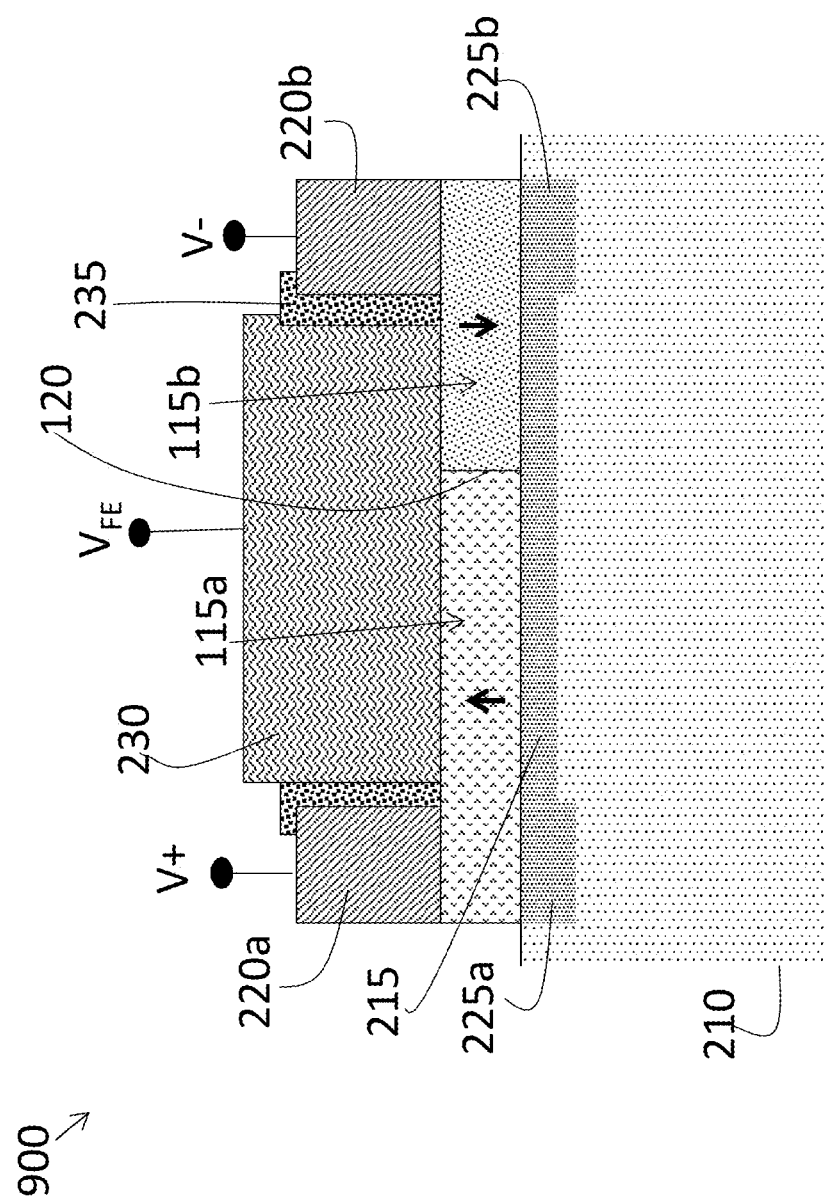
FIG. 9 shows an FEFET with a metal-ferro-silicon (MFS) structure according to one or more embodiments of the invention.

FIGS. 9-12 show different embodiments of the FEFET that acts as an RPU element according to one or more embodiments of the invention. Although FIGS. 9-12 show a bar ferroelectric 110 according to the embodiment shown in FIG. 3, any of the embodiments shown in FIGS. 9-12 can also use the bar ferroelectric according to the embodiment shown in FIG. 4. FIG. 9 shows an FEFET 900 with a metal-ferro-silicon (MFS) structure according to one or more embodiments of the invention. That is, the bar ferroelectric 110 is under the source 220a and drain 220b terminals and separates the source 220a and drain 220b terminals from the doped regions 225a, 225b of the silicon substrate 210 according to the embodiment.

Figure 10:
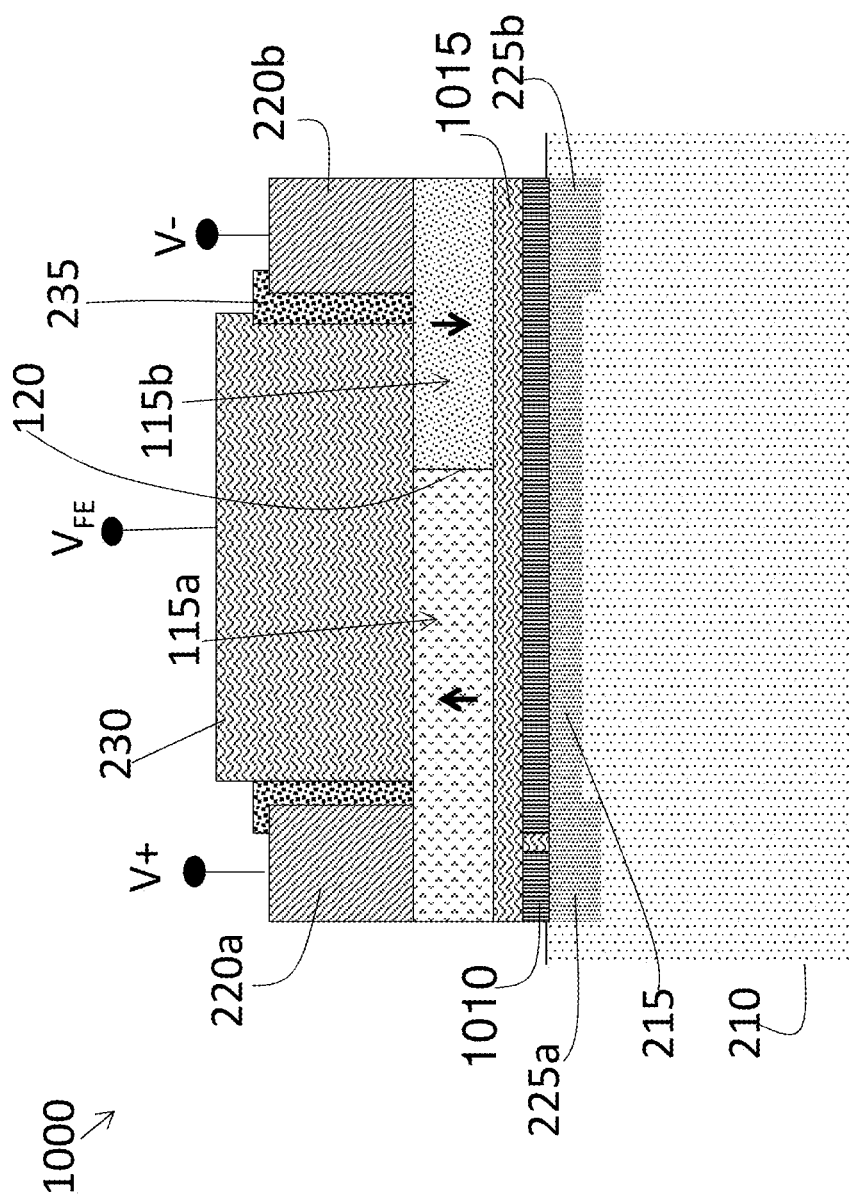
FIG. 10 shows an FEFET with an insulator layer below the bar ferroelectric according to one or more embodiments of the invention.

FIG. 10 shows an FEFET 1000 with an insulator layer 1010 below the bar ferroelectric 110 according to one or more embodiments of the invention. This embodiment can be thought of as including a metal-ferro-metal (MFM) top or a MFM in combination with a metal-insulator-silicon FET (MISFET). That is, the bar ferroelectric 110 is between the source 220 and drain 220b terminals and a quantum metal 1015 below the bar ferroelectric 110. The quantum metal 1015 is doped Strontium Titanate, for example. While an electric field can penetrate the quantum metal 1015, having the quantum metal 1015 below and the metal of the gate 230 above the bar ferroelectric 110 results in more stable domains by lowering the domain energy. The insulator layer 1010 is between the quantum metal 1015 and the doped regions 225a, 225b of the silicon substrate 210. The insulator layer 1010 can be an oxide, nitride, or high-k dielectric, for example.

Figure 11:
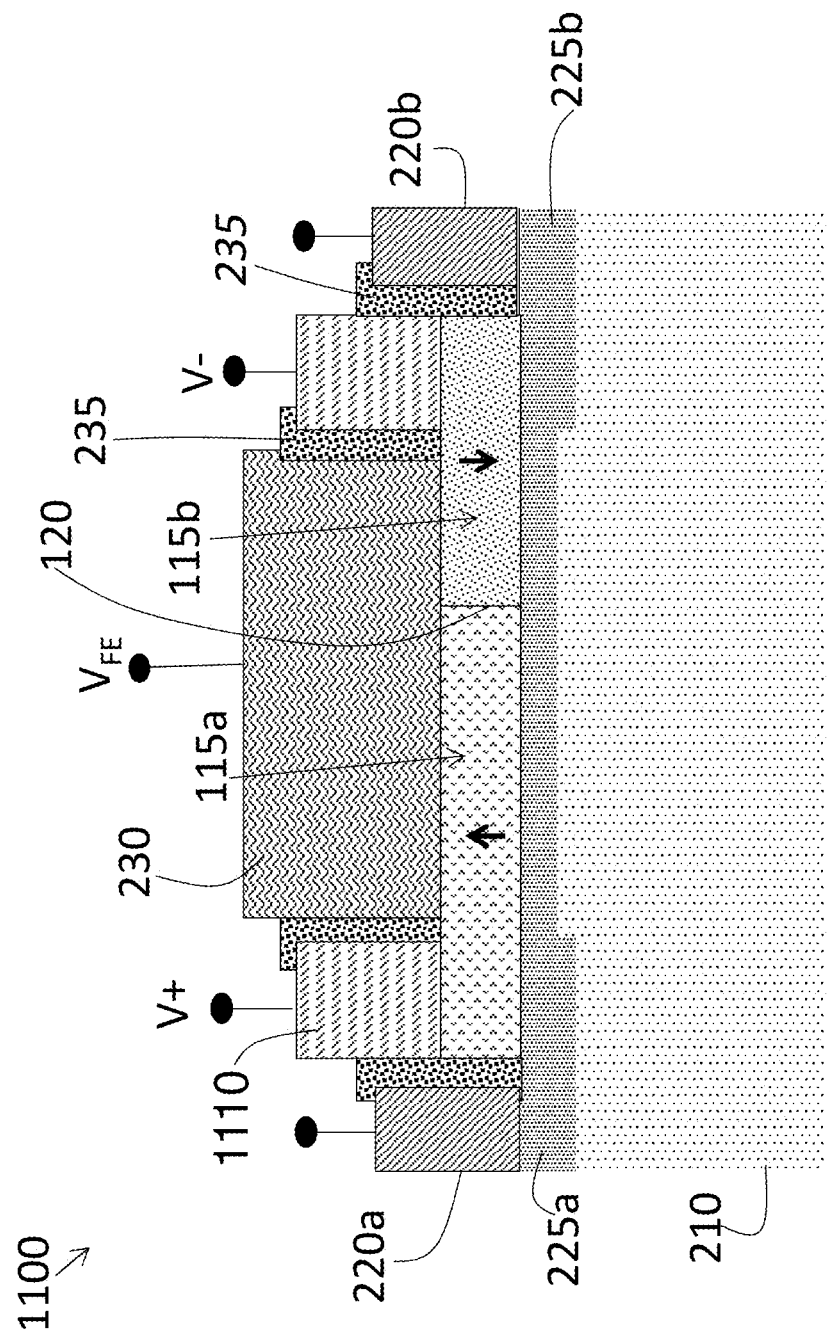
FIG. 11 shows an FEFET with five terminals according to one or more embodiments of the invention.

FIG. 11 shows an FEFET 1100 with five terminals according to one or more embodiments of the invention. The FEFET 1100 in FIG. 11 includes another set of spacers (insulator 235) and a pair of electrodes 1110. Based on the arrangement of the embodiment shown in FIG. 11, the electrodes 1110 include terminals to apply the pinning voltages V+ and V− to the bar ferroelectric 110. The source 220a and drain 220b additionally include terminals. The pulses ($V_{FE}$) to achieve a single domain wall 120 for the bar ferroelectric 110 and to move the domain wall 120 are applied through the gate 230 terminal. As such, the FEFET 1100 includes five terminals. The conductance of the FEFET 1100 can be read directly using the terminals of the source 220a and drain 220b.

Figure 12:
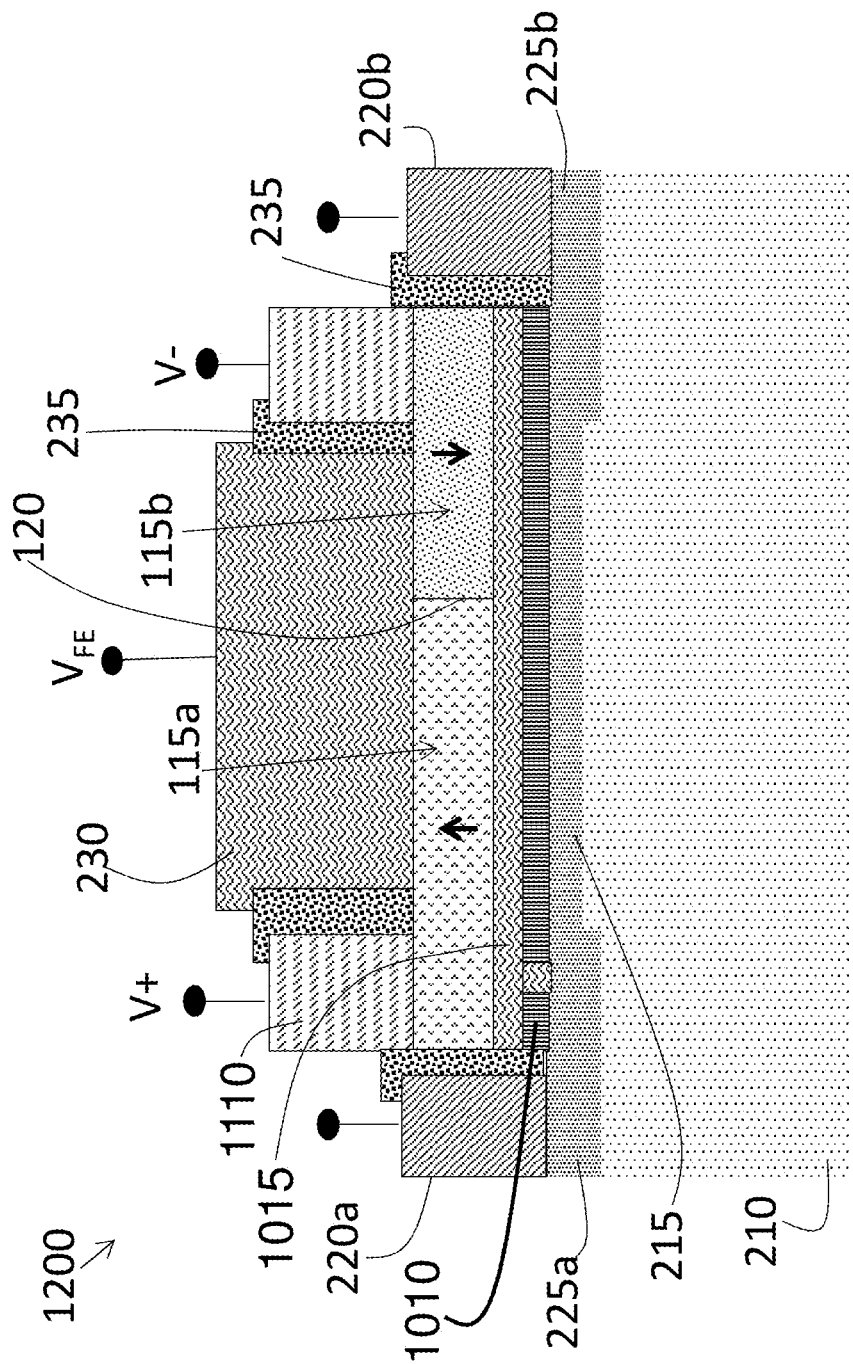
FIG. 12 shows an FEFET with an insulator layer below the bar ferroelectric and five terminals according to one or more embodiments of the invention.

FIG. 12 shows an FEFET 1200 that is a MISFET with five terminals according to one or more embodiments of the invention. Like the embodiment shown in FIG. 10, the FEFET 1200 includes an insulator layer 1010 between the quantum metal 1015 and doped regions 225a, 225b of the silicon substrate 210. The FEFET 1200 also includes five terminals as described for the FEFET 1100 shown in FIG. 11. This is based on the addition of the electrodes 1110. As such, like the FEFET 1100 shown in FIG. 11, the FEFET 1200 shown in FIG. 12 facilitates sensing the conductance of the device and, thus, the value stored according to movement of the domain wall 120 directly using the terminals of the source 220a and drain 220b.

Figure 13:
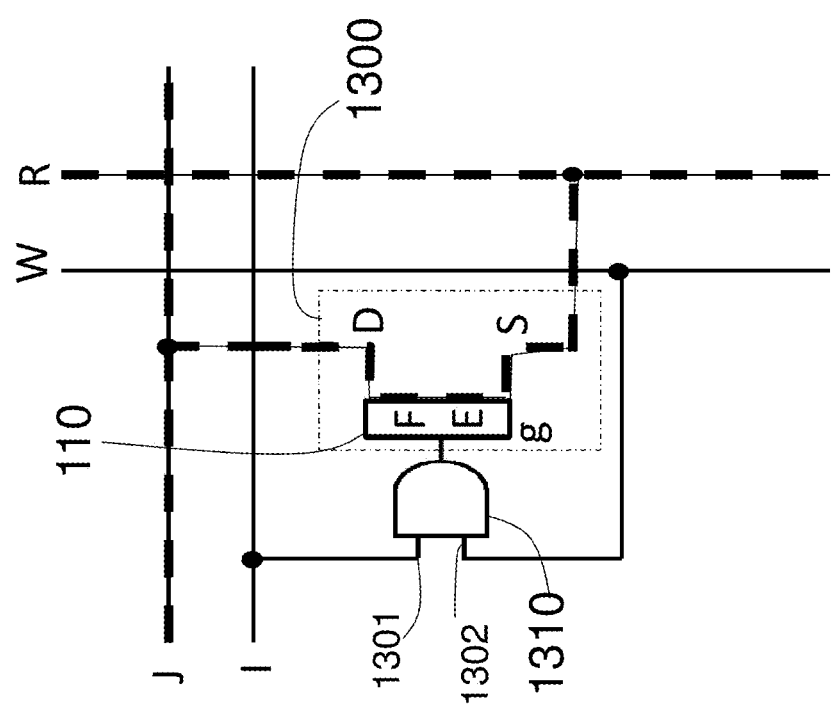
FIG. 13 shows the read and write circuitry for an RPU element that includes a bar ferroelectric with a single domain wall according to one or more embodiments of the invention.

FIG. 13 shows the read and write circuitry for an RPU element 1300 that includes a bar ferroelectric 110 with a single domain wall 120 according to one or more embodiments of the invention. The RPU element 1300 can be fabricated using an FEFET 200, 900, 1000, 1100, 1200 according to one of the embodiments shown in FIG. 2 or 9-12, for example. As previously noted, an RPU can include thousands of RPU elements 1300 (e.g., 5000 by 5000 array), each of which includes circuitry to write and read values. As FIG. 13 indicates, pulses coincident on the I and W lines are input at 1301 and 1302, respectively, to an AND gate 1310 and result in a pulse being applied to the gate g of the RPU element 1300. As previously detailed, the pulse moves the domain wall 120 of the bar ferroelectric 110 and changes the conductance of the RPU element 1300. The number of pulses applied via the I and W lines determines the conductance set for the RPU element 1300. Reading the conductance and, thus, the value set for the RPU element 1300 involves grounding the I and W lines, applying a small voltage between the J and R lines, and measuring the current, which is a measure of the conductance. Erasing the value written by the pulses applied over the I and W lines involves applying the same number of negative pulses as positive pulses. This involves essentially replacing the AND gate 1310 shown in FIG. 13 with a NAND gate. This is accomplished with a circuit that is not shown in FIG. 13.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A symmetric element of a resistive processing unit (RPU), the element comprising:
    a substrate with a channel region connecting two doped regions;
    a source above one of the two doped regions;
    a drain above an other of the two doped regions, wherein the source and the drain are entirely above the channel region that connects the two doped regions;
    a gate above the channel region;
    a bar ferroelectric above the channel region and below the gate; and
    a first electrode between the source and the gate and a second electrode between the drain and the gate, wherein the first electrode and the second electrode are directly on and entirely above the bar ferroelectric.

2. The element according to claim 1, wherein the bar ferroelectric separates the source and the one of the two doped regions from the drain and the other of the two doped regions because the source and the one of the two doped regions are formed on an opposite side of the bar ferroelectric from the drain and the other of the two doped regions.

3. The element according to claim 1, further comprising an insulator layer above the channel region.

4. The element according to claim 3, wherein the insulator layer separates the channel region and the bar ferroelectric.

5. The element according to claim 3, wherein the insulator layer separates the channel region from the first electrode and the second electrode above the bar ferroelectric.

6. The element according to claim 3, further comprising a quantum metal above the insulator layer.

7. The element according to claim 6, wherein the quantum metal separates the bar ferroelectric from the insulator layer.

8. The element according to claim 6, wherein the quantum metal is doped Strontium Titanate.

9. The element according to claim 3, wherein the insulator layer is an oxide, a nitride, or a high-k dielectric.

10. The element according to claim 1, wherein the bar ferroelectric includes a first portion and a second portion separated by a domain wall.

11. The element according to claim 10, wherein the first portion and the second portion have opposite polarities.

12. The element according to claim 1, wherein a length of the bar ferroelectric is between 0.1 and 1 micrometers.

13. The element according to claim 1, wherein the two doped regions are n++doped.

14. The element according to claim 1, wherein the substrate includes a bulk semiconductor.

15. The element according to claim 1, wherein the substrate includes an organic semiconductor or a layered semiconductor.

* * * * *